United States Patent
Ouyang et al.

(10) Patent No.: US 8,294,485 B2
(45) Date of Patent: Oct. 23, 2012

(54) DETECTING ASYMMETRICAL TRANSISTOR LEAKAGE DEFECTS

(75) Inventors: Xu Ouyang, Hopewell Junction, NY (US); Yun-Yu Wang, Hopewell Junction, NY (US); Yunsheng Song, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 12/699,211

(22) Filed: Feb. 3, 2010

(65) Prior Publication Data

US 2010/0201376 A1 Aug. 12, 2010

Related U.S. Application Data

(60) Provisional application No. 61/152,014, filed on Feb. 12, 2009.

(51) Int. Cl.
 *G01R 31/02* (2006.01)
 *G01R 31/08* (2006.01)

(52) U.S. Cl. .................. 324/762.01; 324/522

(58) Field of Classification Search ............ 324/762.01, 324/537, 500, 555, 522, 718, 715, 713, 691, 324/649, 600, 523, 527, 76.11
See application file for complete search history.

(56) References Cited

U.S. PATENT DOCUMENTS

| | | |
|---|---|---|
| 5,759,871 A | 6/1998 | Hause et al. |
| 6,258,437 B1 | 7/2001 | Jarvis |
| 6,268,717 B1 | 7/2001 | Jarvis et al. |
| 6,294,397 B1 | 9/2001 | Jarvis et al. |
| 6,297,644 B1 | 10/2001 | Jarvis et al. |
| 6,429,452 B1 | 8/2002 | Jarvis |
| 6,552,941 B2 | 4/2003 | Wong et al. |
| 6,577,149 B2 | 6/2003 | Doong et al. |
| 6,636,064 B1 | 10/2003 | Satya et al. |
| 6,977,195 B1 | 12/2005 | Bush et al. |
| 7,103,860 B2 | 9/2006 | Price et al. |
| 7,274,072 B2 | 9/2007 | Chang et al. |
| 7,316,935 B1 | 1/2008 | Hata |
| 7,408,335 B1 * | 8/2008 | Wong et al. .............. 323/316 |
| 7,797,068 B2 * | 9/2010 | Kyoh .......................... 700/110 |
| 2002/0093360 A1 * | 7/2002 | Nagata ....................... 324/765 |

* cited by examiner

*Primary Examiner* — Hoai-An D Nguyen
(74) *Attorney, Agent, or Firm* — Ian D. MacKinnon; Howard D. Cohn

(57) ABSTRACT

A method of detecting low-probability defects in large transistor arrays (such as large arrays of SRAM cells), where the defects manifest themselves as asymmetrical leakage in a transistor (such as a pulldown nFET in an SRAM cell). These defects are detected by creating one or more test arrays, identical in all regards to the large transistor arrays up until the contact and metallization layers. Leakage is measured by applying an appropriate off-state voltage (e.g., 0V) by a common connection to all of the gates of the transistors in the test array, then measuring the aggregate drain/source leakage current, both forward and reverse (e.g., first grounded source and positively biased drain, then grounded drain and positively biased source) comparing the difference between the two leakage current measurements.

5 Claims, 7 Drawing Sheets

DETECTING ASYMMETRICAL TRANSISTOR LEAKAGE DEFECTS

PRIORITY

This non-provisional application claims the benefit of the provisional application filed with the U.S. Patent and Trademark Office as Ser. No. 61/152,014 entitled "DETECTING ASYMMETRICAL TRANSISTOR LEAKAGE DEFECTS", filed Feb. 12, 2009.

FIELD OF THE INVENTION

The invention relates to semiconductor device fabrication and testing and, more particularly, to detecting leakage defects in transistors, such as field effect transistors (FETs), particularly nFETs, such as may be used in 6T (six transistor) static random access memory (SRAM) cells.

BACKGROUND OF THE INVENTION

A transistor is a solid-state semiconductor device that can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a voltage applied to the gate (G) controls current flowing between the source (S) and drain (D). In FETs, the source-to-drain current flows in a narrow conducting channel formed near (usually primarily under) the gate. This conductive channel permits electrical current to flow between the source and drain terminals. By varying the voltage between the gate (G) and source (S) terminals, the conductive channel region is widened and narrowed in response, thereby making the electrical path between the drain (D) and source (S) terminals (via the channel region) correspondingly more or less conductive controlling the current flowing therebetween.

FIG. 1 shows a cross-sectional view of a FET 100 and the schematic symbol 120 generally associated therewith. The FET 100 comprises a p-type substrate 102 (which may be implemented as p-well in an n-type substrate), and two spaced-apart n-type diffusion areas 104A and 104B, one of which (104A) serves as the "source" of the transistor while the other (104B) serves as the "drain" of the transistor. A thin dielectric layer 108 ("dielectric") is disposed on the substrate overlying and spanning the space between the source 104A and drain 104B, and a "gate" conductor 106 (G) is disposed atop the dielectric layer, also spanning the space between the source 104B and drain 104B. The dielectric under the gate is also commonly referred to as "gate oxide" or "gate dielectric". The area 110 of the p-type substrate 102 between the n-type source 104A and n-type drain 104B immediately underlying the dielectric 108 is the "channel" of the FET 100. The channel 110 is where current flows between the source 104A (S) and the drain 104B (D).

Electrical connections (not shown) may be made to the source 104A (S), the drain 104B (D), and the gate 106 (G). The substrate 102 may be grounded or biased at a desired voltage depending on the application.

Assuming that the substrate 102 and source 104A are kept at the same voltage (e.g., by connecting them together), the voltage applied between the gate 106 and source 104A controls the conductivity of the channel 110. Generally, when the gate-to-source voltage (Vgs) is zero and a positive voltage (relative to the source 104A) is applied to the drain 104B, there is no electrical conduction between the source 104A (S) and the drain 104B (D) because the "p-type" material in the channel 110 forms a non-conductive "depletion region" free of mobile carriers. As voltage applied to the gate 106 becomes more positive relative to the source 104A, a "field effect" occurs in the channel 110 whereby the positive voltage attracts free electrons in the substrate 102 into the channel region. Before current can flow in the channel, however, enough electrons must be attracted into the channel region 110 to counter the p-type dopant ions therein. The gate-to-source voltage at which this occurs is known as the "threshold voltage" (Vt) of the FET. As the gate-to-source voltage is increased above Vt, additional free-floating electrons attracted into the channel 110 effectively convert the p-type material to n-type, permitting current flow between source 104A and drain 104B. When Vgs is below the threshold voltage Vt the channel 110 is non-conductive. When Vgs is greater than Vt, the channel 110 is conductive, with greater conductivity associated with greater Vgs.

The FET 100 shown in FIG. 1 is typical of an n-channel enhancement mode MOSFET. It is referred to as an "n-channel" device because conduction occurs through an n-type conductive channel formed in a p-type substrate. It is referred to as an "enhancement mode" FET because in its un-energized state with zero gate-source voltage, the channel is non-conducting. The field-effect is used to "enhance" the normally non-conductive channel region to make it conductive. The name "MOSFET" refers to the physical configuration of the FET: metal (gate) overlying oxide (dielectric) overlying semiconductor (channel/substrate), hence Metal-Oxide-Semiconductor FET. Hereinafter, this type of n-channel FET will be referred to as an "nFET".

Exchanging p-type and n-type dopants in the example of FIG. 1 creates a similar, but oppositely polarized "p-channel" MOSFET or "pFET". A pFET is formed in an n-type substrate (or in an n-well). Spaced-apart p-type source and drain regions are formed within the substrate (or well) and a thin gate oxide and gate conductor are formed above the space between the source and drain regions. This pFET behaves in exactly the same way as the nFET, but with opposite polarity. In CMOS (complementary metal oxide semiconductor) technology, nFETs and pFETs are connected in complementary paired configurations to form amplifiers, inverters, gates, etc.

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

SOI Substrates

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire (also known as silicon-on-sapphire or "SOS"). The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

SiO2-based SOI substrates (or wafers) can be produced by several methods:

SIMOX—Separation by IMplantation of OXygen—uses an oxygen ion beam implantation process followed by high temperature annealing to create a buried SiO2 layer.

Wafer Bonding—the insulating layer is formed by directly bonding oxidized silicon with a second substrate. The majority of the second substrate is subsequently removed, the remnants forming the topmost Si layer.

Seed methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

An exemplary SOI-type substrate may comprise a layer of silicon ("SOI") atop a buried oxide (BOX, insulator) layer, which is atop an underlying substrate which may be a silicon substrate. The BOX layer may have a thickness of 500-2500 Å (50-250 nm). The silicon (SOI) layer may have a thickness of 50-200 Å (5-20 nm). Pad films comprising a layer of oxide and a layer of nitride may be disposed atop the SOI layer. The pad oxide layer may have a thickness of 10-20 Å (1-2 nm), and the pad nitride layer may have a thickness of 400-1500 Å (40-150 nm).

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

A drawback in some SOI circuits is the floating body effect. Due to the additional isolation of the SOI device, the body or well node is not typically contacted. In principal, body tie structures may be employed in SOI CMOS to add a contact to the floating body node, but this introduces parasitic resistances and capacitances that would negate the favorable impact of adaptive well biasing.

For many digital circuits, this impact can be neglected. However, certain circuit array cell stability, such as the commonly used 6T (six transistor) SRAM cell, is degraded due to tolerance issues arising from the floating body. This is typically handled by increasing the linear threshold voltage (Vt) of the FETs in the array, but this is usually at the cost of lowering the overall array performance.

SRAM

Static random access memory (SRAM) is a type of semiconductor memory where the word "static" indicates that it, unlike "dynamic" RAM (DRAM), does not need to be periodically refreshed, as SRAM uses bistable latching circuitry to store each bit. However, SRAM is still volatile in the (conventional) sense that data is lost when powered down.

Random access means that locations in the memory can be written to or read from in any order, regardless of the memory location that was last accessed.

Each bit in an SRAM is stored on four transistors that form two cross-coupled inverters. This storage cell has two stable states which are used to denote 0 and 1. Two additional access transistors serve to control the access to a storage cell during read and write operations. A typical SRAM uses six MOSFETs to store each memory bit.

A typical static random access memory (SRAM) cell includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up pFET (p-channel) transistor connected to a complementary pull-down nFET (n-channel) transistor. The inverters, connected in a cross-coupled configuration, act as a latch which stores the data bit therein so long as power is supplied to the memory array. In a conventional six-transistor cell, a pair of access transistors or pass gates (when activated by a word line) selectively couple the inverters to a pair of complementary bit lines.

Typically, memory cells are arranged in an array comprising many rows and columns, between wordlines extending horizontally (as usually depicted) across the array and bitlines extending vertically (as usually depicted) up and down the array. A memory array typically comprises many millions ("mega"), including billions ("giga") of memory cells.

FIG. 2 illustrates a single conventional six-transistor ("6T") SRAM memory cell 200 connected to two adjacent bitlines 232 (BL) and 234 (BR), and one wordline 220 (WL). The memory cell may also be connected to a voltage source (Vdd) and ground (gnd).

The SRAM cell structure includes a memory cell 200 (in dashed lines) comprising six interconnected MOSFET transistors 202 (P1), 204 (N1), 206 (P2), 208 (N2), 210 (NL) and 212 (NR). Transistors 202 (P1) and 206 (P2) are pFETs; the other four (204, 208, 210 and 212; N1, N2, NL and NR, respectively) are nFETs. pFET P1 202 and nFET N1 204 are connected to form a CMOS inverter circuit, such that a source terminal of pFET P1 202 is connected to Vdd, a source terminal of nFET N1 204 is connected to ground; gates of P1 202 and N1 204 are connected together, forming an input of the inverter and drains of P1 202 and N1 204 are connected together forming an output ("A") of the inverter. Considering the P1-N1 inverter configuration by itself in isolation, the input voltage will be assumed to be either Vdd ("high" or logic "1") or ground ("low" or logic "0"). When the input of the P1-N1 inverter formed by P1 202 and N1 204 is at Vdd (logic "1"), the channel of N1 204 is conductive and the channel of P1 is non-conductive, effectively creating a (relatively) low-impedance path from the output of the inverter to ground. Assuming no other circuit influence (i.e., NL 210 is in a non-conducting state), then since P1 202 is non-conductive in this state no current flows through N1 204 and the voltage at the output ("A") of the inverter is at ground potential (logic "0"). Conversely, when the input of the inverter is at ground potential (logic "0"), the channel of P1 202 is conductive while the channel of N1 204 is non-conductive. Again assuming no outside circuit influence, no current flows through either P1 202 or N1 204, but since P1 204 is conductive and N1 is non-conductive in this state, the output ("A") of the P1-N1 inverter is at Vdd potential (logic "1"). Accordingly, whichever state the input of the P1-N1 inverter assumes, the output will assume the opposite or "inverse" state—hence the name "inverter".

pFET P2 206 and nFET N2 208 are similarly connected in an inverter configuration, producing an output "B". The P1-N1 inverter is cross-connected with the P2-N2 inverter such that the output "A" of the P1-N1 inverter connects to the input of the P2-N2 inverter and the output "B" of the P2-N2 inverter connects back to the input of the P1-N1 inverter in a positive feedback configuration that forms a bi-stable "latch" circuit. The circuit is bi-stable, because it has two possible states and if undisturbed, it will remain indefinitely in whichever of the two states it is placed.

The voltages at the outputs "A" and "B" of the P1-N1 and P2-N2 inverters characterize the two states of the bi-stable latch circuit. If "A" is at logic "0", then the output "B" of the P2-N2 inverter (which has "A" as its input) will be at logic "1". Since "B" provides the input to the P1-N1 inverter, this reinforces the logic "0" at "A", which is also the output of the P1-N1 inverter. This circuit state is stable and will remain indefinitely unless disturbed or until power is removed. Accordingly, this circuit condition characterizes one state of the bi-stable latch formed by P1 202, N1 204, P2 206 and N2 208.

Conversely, if "A" is at logic "1", then the output "B" of the P2-N2 inverter (which has "A" as its input) will be at logic "0". Since "B" provides the input to the P1-N1 inverter, this reinforces the logic "1" at "A", which is also the output of the P1-N1 inverter. This circuit state is also stable and will remain indefinitely unless disturbed or until power is removed. Accordingly, this circuit condition characterizes a second state of the bi-stable latch formed by P1 202, N1 204, P2 206 and N2 208.

In this bi-stable latch circuit, since no current flows in either stable state, transistors P1 202, N1 204, P2 206 and N2 208 need not present a very low impedance to Vdd or ground in their respective conductive states. This means that if a very low-impedance driving circuit is connected to output "A" and/or output "B", these outputs can be overwhelmed and overridden to place them at a different potential. nFET NL 210 acts as a passgate (effectively a switch) to connect the output "A" of the P1-N1 inverter to a bitline BL 232, and nFET NR 212 acts as another passgate to connect the output "B" of the P2-N2 inverter to another bitline BR 234. The gates of NL 210 and NR 212 are connected together to a "write line" WL 220 so that they operate in concert. When WL 220 is at Vdd potential (logic "1"), NL 210 and NR 212 are conductive, connecting "A" to BL 232 and "B" to BR 234. Conversely, when WL 220 is at ground potential (logic "0") NL 210 and NR 212 are non-conductive, effectively isolating "A" and "B" from BL 232 and BR 234.

Bitlines BL 232 and BR 234 can be driven by a low impedance source to opposite logical states. When WL 220 is at a logic "0" state (ground-NL 210 and NR 121 non-conducting) the state of the bi-stable latch formed by P1 202, N1 204, P2 206 and N2 208 is unaffected. However, when WL 220 is at a logic "1" state (Vdd), "A" is forced to assume to voltage level (logic state) present on BL 232 and "B" is forced to assume the voltage level (logic state) present on BR 234. If the voltage levels on bitlines BL 232 and BR 234 are opposite those present on "A" and "B", respectively prior to when passgates NL 210 and NR 212 were made conductive, the bi-stable latch changes state. (It should be noted that although current must flow to overwhelm the inverter outputs, this current only flows until the bi-stable latch reaches its new stable state, at which time further current flow ceases.) When WL 220 is returned to logic "0", NL 210 and NR 212 stop conducting and the bi-stable latch retains its new state. In this manner, the SRAM cell 200 can be placed in either of two stable states, which it will retain until re-written (as just described) or until power is removed.

Bitlines BL 232 and BR 234 can also be used to read out the current state of the bi-stable latch (SRAM cell 200) non-destructively. If bitlines BL 232 and BR 234 are left un-driven (i.e., in a high-impedance state), then when "WL" is at logic "1" (Vdd) potential, the voltages at "A" and "B" will appear on bitlines BL 232 and BR 234, respectively. Given that the SRAM memory cell 200 can assume either of two stable states, that those states can be externally applied and can be read back non-destructively, the SRAM memory cell 200 can be said to be capable of storing one "bit" (binary digit) of information.

Leakage in MOSFETs

It is well known to those of ordinary skill in the art that even when well formed, practical MOSFET devices may exhibit some very small amount of "leakage", which as used herein refers to undesired current flow between source and drain when a transistor is in its "off" or nominally non-conducting state. Generally, in well-formed MOSFETs, such leakage current is near zero and is vanishingly small when compared to "on" state current. It is also well known that certain types of defects in the fabrication and processing of MOSFETs devices can result in leakage currents that are much higher than normal.

CMOS (Complementary MOS) circuits (such as inverters and logic gates) generally rely on complementary pairings of n-channel and p-channel MOSFETs (nFETs and pFETs) wherein nFET and pFET devices are operated alternately such that when an nFET device is active or "on" (conducting) its associated complementary pFET device is inactive or "off" (non-conducting), and vice-versa. As a result, only leakage current flows in a CMOS circuit that is in a stable, non-transitioning logic state.

When leakage current is near zero (which is the normal case for well-formed MOSFETs) then CMOS circuits require virtually zero-power to maintain their stable, non-transitioning logic states. However, high leakage current in even a single transistor can cause numerous problems in CMOS circuits, including, but not limited to: high power consumption, localized heating, and significant change in the output voltage representing either or both of the circuits stable logic levels. These localized problems due to MOSFET leakage can in turn cause problems in other neighboring CMOS circuits to which such leakage-affected circuits connect. Depending upon circuit configuration and the severity of a leakage defect, a single "leaky" MOSFET can render useless an entire semiconductor chip comprising millions of MOSFETs. For example, in the absence of redundancy mechanisms, even a single bad "bit" in a large SRAM device comprising millions of bits of storage capacity would constitute an irrecoverable failure of the device.

RELATED PATENTS AND PUBLICATIONS

U.S. Pat. No. 6,977,195, incorporated by reference herein, discloses test structure for characterizing junction leakage current. For characterizing bulk leakage current of a junction, a center junction surrounded by an isolation structure is formed with a first depth. In addition, at least one periphery junction having a second depth greater than the first depth is formed in a portion of the center junction adjacent the isolation structure. A junction silicide is formed with the center and periphery junctions. The magnitude of a reverse-bias voltage across the junction silicide and the P-well is incremented for determining a critical magnitude of the reverse-bias when current through the junction silicide and the P-well reaches a threshold current density.

U.S. Pat. No. 5,759,871 incorporated by reference herein, discloses structure for testing junction leakage of salicided devices fabricated using shallow trench and refill techniques. A resistor protect mask is used on a shallow trench isolation device junction to cover a device area except for a strip on the perimeter of the device area. The silicide layer formed on the central surface portion of the device and the strip area on the perimeter of the device upon which silicide formation is prevented forms a test structure for evaluation of junction formation that is immune from the effects of silicide formation on a device trench sidewall. Electrical tests and leakage measurements upon the test structure are compared directly to similar silicide shallow trench isolated devices which do not incorporate the resistor protect mask and shallow trench isolated devices without silicide to determine whether salicide processing is a cause of junction effects including junction leakage and short-circuiting.

SUMMARY OF THE INVENTION

There are many types of defects that can cause asymmetric leakage of transistors. Typically one of several mechanisms damages either the source or drain of a MOSFET, resulting in a "leaky" p-n junction with the oppositely doped channel. One example is Boron diffusion in SRAM cells. Boron (a "p" type dopant) diffuses very fast and can easily diffuse into an nFET source or drain if the p+/n+ implant boundary is sufficiently close to the nFET. This causes asymmetric leakage, which cannot be detected unless the "off-state" leakage current is measured with the drain-to-source voltage both positively and negatively biased, particularly in SOI technology. Another example of a mechanism that can cause asymmetric leakage is NiSi encroachment defect that arises randomly on the source or drain side of the transistor and damages the source or drain junction. Because the probability for NiSi defects to arise in both the source and drain of the same transistor is small, in a typical case either source or drain is damaged, and the damage cannot be detected unless source and drain are swapped (i.e., the drain-to-source voltage is made both positive and negative) during testing.

It is a general object of the invention to provide on-wafer test apparatus capable of detecting asymmetric leakage defects early in the process flow.

It is another object of the invention to design the test apparatus to be representative of the product on the same reticle so that it correctly reflects the process sensitivities of the product (e.g., mask alignment, etc.).

It is another object of the invention to design the test apparatus so that the unsymmetrical leakage current could be measured and separated from the regular transistor off current.

It is another object of the invention to provide an overlay or misalignment monitor for the failure mechanism shown in FIG. 3, which is sensitive to the overlay between NFET poly gate and N+/P+ implant boundary.

A novel test structure and test method are disclosed herein to detect such defects/damages, advantages of which may include:

1. Tested early compared to current SRAM detection. Testable at M1.
2. Targets test structure and method which clearly separate the problem to be detected from many other defect issues (currently rely on SRAM failure analysis, in which many other yield loss mechanisms can be confounded with each other).

Generally, test structures and methods are described to detect failure at the first metal level. The failure being tested results in leakage current that is not symmetric, and is significant enough to be detected. Utilizing the fact that the leakage current is not symmetric, the failure can be detected by taking two measurements, by swapping source and drain, and comparing the two measurements. The SRAM array may be broken down into blocks (or sub-blocks) by leakage/$I_{off}$ ratio, where $I_{off}$ is the sum of the regular off state current of the transistors in the SRAM array, and each block is tested separately to facilitate detecting the problem.

The method and apparatus disclosed herein is useful for detecting boron (B) diffusion defects, but is also used for detecting NiSi encroachment defects and any other defects that cause asymmetric transistor leakage.

According to an embodiment of the invention, a method of detecting leakage in a transistor having a channel, a first diffusion on one side of the channel, and a second diffusion on another side of the channel, comprises: measuring leakage current in one direction between the two diffusions; measuring leakage current in an opposite direction between the two diffusions; and comparing the two measurements. The leakage current may be measured by applying a voltage differential across the two diffusions. The test method may comprise swapping the voltage polarity while testing and comparing the difference of current-voltage curves measured in order to detect the leakage current.

According to an embodiment of the invention, a method of detecting defects in an array of transistors comprises: dividing the array into a number of sub-blocks; and determining a size for the sub-blocks based on a leakage current (I_leakage) of one defective transistor in a sub-block being significantly larger than the sum of the leakage (or "off") currents (I_off) of all the non-defective transistors in the sub-block. The leakage current may be ten times greater than the off current. The size of the sub-blocks may be limited based on a safety factor. The sub-blocks may be tested one at a time using a sub-block selection decoder to select the sub-block being tested.

According to an embodiment of the invention, a test structure for detecting asymmetrical transistor leakage comprises: arrays of modified SRAM cells side-by-side with real SRAM on the same reticle so that product layout sensitive defects can be detected. The modified SRAM cells may include modifications on contact and metal 1 levels while all prior levels are not modified so that asymmetrical transistor leakage can be detected. Furthermore, they can be wired in such a way that even and odd columns can be separately tested and the difference of testing results reflects leakage-sensitive misalignment. The test structure may consist of sub-blocks, wherein the size of each sub-block is determined by a ratio of the leakage current caused by a single defect and the off current of a regular SRAM transistor. The leakage current (I_leakage) of one defective transistor in a sub-block may be significantly larger than the sum of the leakage (or "off") currents (I_off) of all the non-defective transistors in the sub-block. The test structure may comprise a sub-block selection decoder which selects and connects each sub-block to several pads so that the design space occupied by the pads can be minimized.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity.

In the drawings accompanying the description that follows, both reference numerals and legends (labels, text descriptions) may be used to identify elements. If legends are provided, they are intended merely as an aid to the reader, and should not in any way be interpreted as limiting.

DETAILED DESCRIPTION OF THE INVENTION

Many modern semiconductor device designs incorporate on-wafer and on-chip test structures and rely upon in-process testing steps incorporated into the manufacturing process. Typically, these in-process testing steps involve the use of external probing and test equipment to exercise the on-wafer and on-chip test structures. Preferably, these tests are employed as early as possible in the fabrication process so that defects are detected as early as possible, thereby permitting compensating process adjustments to be made before large numbers of faulty chips are produced. In the undesirable alternative, when defects are detected late in the manufacturing process (e.g., in final testing after packaging) considerable quantities of faulty product may be produced before compensating corrections to the manufacturing process can be made, thereby reducing process yield and dramatically increasing cost. The earlier a failure is detected; the earlier it can be corrected and the less cost there is associated with scrapped product.

MOSFET leakage, as described hereinabove, may cause such yield degradation. One manifestation of asymmetric leakage particular to nFET devices in certain SRAM cells has proven to be undetectable by conventional early-in-process testing structures and protocols, becoming evident only late in the manufacturing process when testing finished or nearly finished devices. An "asymmetric" leakage in a MOSFET is one where leakage is greater in one direction than in the other, i.e., greater when the MOSFET source is biased positively with respect to the drain than when the drain is biased positively with respect to the source, or vice-versa.

Figure 1:
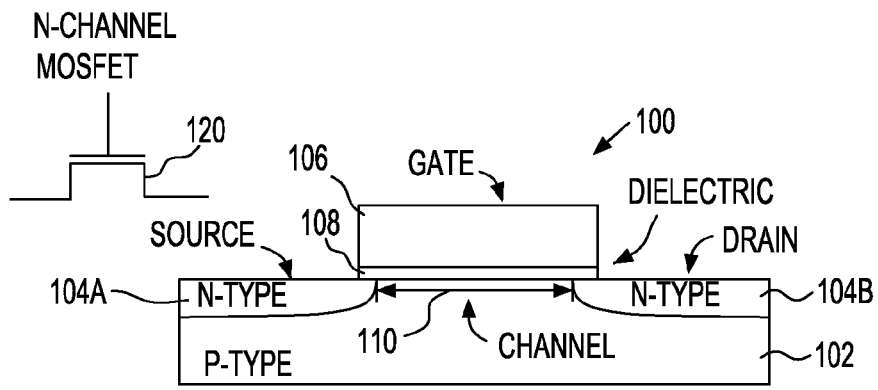
FIG. 1 is a diagram of an FET, typically an NFET (having n+ diffusions), typically in a p-well, according to the prior art.
Figure 2:
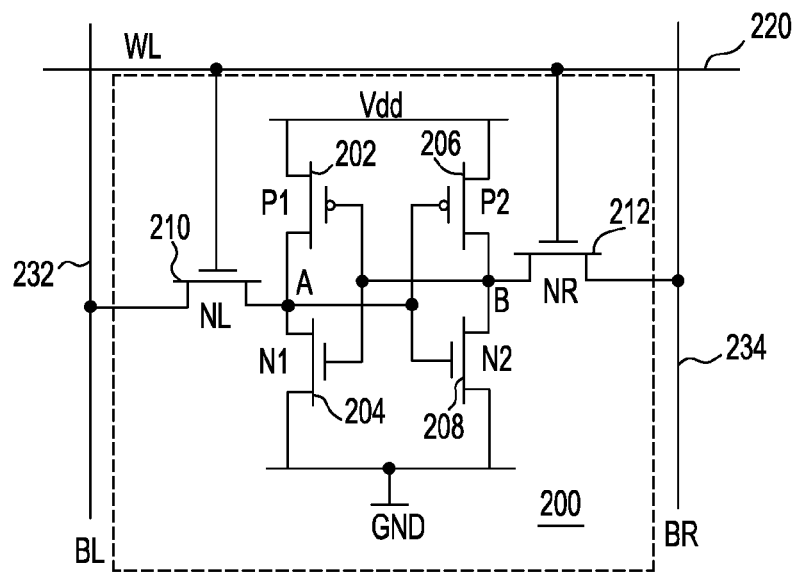
FIG. 2 is a diagram of a 6T SRAM, according to the prior art.

In this particular type of asymmetric leakage only nFETs are involved, such that specific shifts in the position of a p+/n+ implant boundary (due, e.g., to slight mask misalignment during implantation) are associated with an increasing statistical probability of the aforementioned asymmetric leakage defect. Under this scenario, a shift of the p+/n+ implant boundary towards the position of the nFET in a complementary pFET/nFET pair is associated with an increased probability of weakening of the affected nFET's source or drain extension resulting in a "leaky" p-n junction between the affected n+ extension and the p+ channel. The probability of such a defect affecting any one transistor is extremely low, but when considering a very large SRAM array, even a very low defect rate can present a considerable risk of a single defect occurring within an array that may include hundreds of thousands or even millions of nFETs. Damage to even one of the pull-down transistors in a single 6T SRAM cell of a large SRAM array (e.g., N2 in FIG. 2) will render the whole SRAM array useless. (To be useful, a typical SRAM array must be 100% functional.) Existing test structures are not well suited to detecting this type of low-probability defect.

In order to facilitate the descriptions herein and to emphasize the property of many FETs whereby "source" and "drain" designations are effectively interchangeable (at least in a small-signal sense), a "side" of a transistor is used to refer to either a source or a drain "side". Accordingly, a FET has two "sides" and if one "side" of the transistor is the source, then the other "side" is the drain, and vice-versa.

Figure 3A:
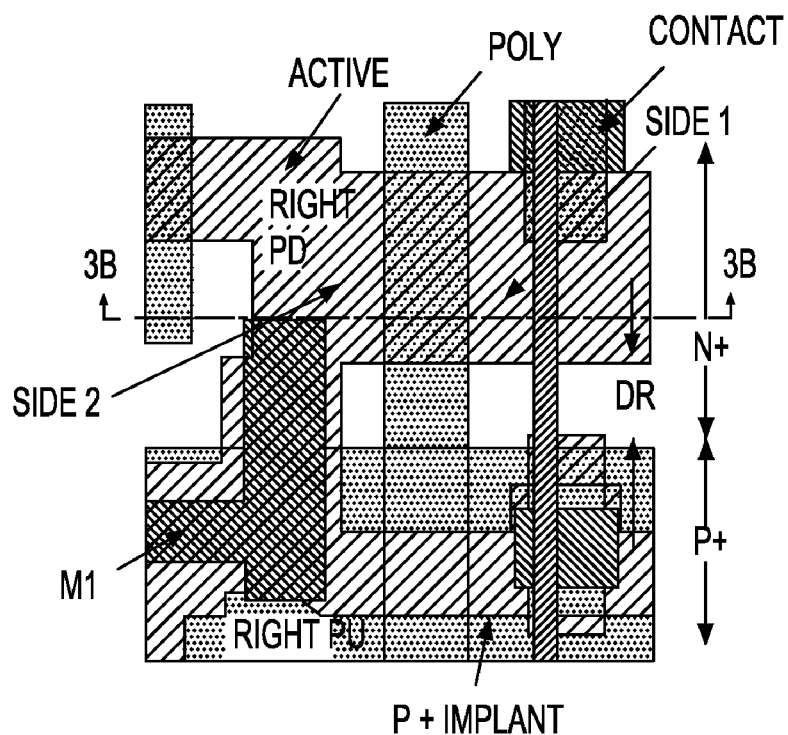
FIG. 3A illustrates a specific example of a layout sensitive defect in a product SRAM causing asymmetric leakage current.
Figure 3B:
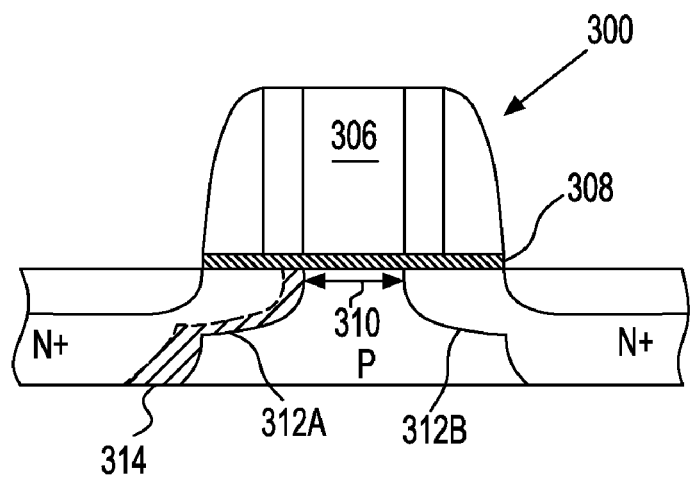
FIG. 3B illustrates a specific example of a layout sensitive defect in a product SRAM causing asymmetric leakage current.

FIG. 3A is a color-coded multi-layer plan-view representation of a portion of a typical SRAM cell in which asymmetric leakage may occur. In this view, a dashed section line 3B indicates the site and viewing direction associated with the cross-sectional view of FIG. 3B is taken. In FIG. 3A, a layout associated with a complementary pair of MOSFETs in a pull-up/pull-down (push-pull) inverter configuration, wherein the label "right pu" generally indicates a region associated with a pFET pull-up and the label "right pd" generally indicates a region associated with an pFET pull-down. "Side 1" generally indicates the location of the drain sides of the MOSFETs and "Side 2" generally indicates the location of the source sides of the MOSFETs. "M1" and "Contact" indicates Metallization layer 1 conductive structures. "P+" generally indicates a region associated with the pFET while "N+" generally indicates a region associated with the nFET. The vertical bar labeled "Poly" is gate polysilicon, spanning both the pFET and the pFET, effectively connecting the gates of the pFET and nFET together (typical of CMOS technology; see, e.g., FIG. 2, "A", "B").

"DR" indicates a critical dimension to which asymmetric leakage of the nFET has been shown to be sensitive. "DR" is a measure of the distance between the P+ implant (forming the basis of the source and drain of the pFET "right pu", and N+ diffusion forming the source and drain of the nFET. As "DR" becomes smaller, the probability of damage to the drain side of the nFET increases.

FIG. 3B is a cross-sectional view of an nFET 300 representative of the nFET "right pd" of FIG. 3A, with the cross section taken through the section line "3B". In the Figure, an n+ drain extension structure (312A) is spaced apart from an n+ source extension structure (312B) by a p-doped channel region (310). A thin gate dielectric 308 isolates a conductive (e.g., polysilicon) gate structure 306 overlying the channel region 310.

Referring to FIGS. 3A and 3B, experimentation has shown that for the SRAM layout shown and described above (a portion of which is shown in FIG. 3A), when the P+ implant is shifted (e.g., by slight variations of mask alignment within the permissible layout design tolerances) such that the critical dimension "DR" decreases, the likelihood of asymmetric leakage in the "right pd" nFET (300). Conversely, when the critical dimension "DR" is increased (again, within the permissible mask alignment tolerances), the failure rate decreases or completely disappears.

Failure analysis has shown that nFETs that fail under these conditions are affected as shown in FIG. 3B, wherein an area of damage (314) occurs within the n+ drain extension. This damage causes the PN junction formed between the n+ drain extension 312A and the p-doped channel 310 to exhibit considerable leakage under reverse-bias conditions.

In a "normal" (undamaged) nFET, when the transistor is off (i.e., no n-channel formed between source and drain), the electrical path from source to drain (and vice-versa) appears as two serially-connected but oppositely facing diodes. The p-n junction between the P+ doped channel region and the N+ doped source extension forms the first diode while the p-n junction between the P+ doped channel region and the N+ doped drain extension forms the second. Under these circumstances, if a voltage of any polarity is applied across the source and drain of the nFET, one of the two diodes will be reverse-biased and will prevent any significant current from flowing. If, however, one of the diodes is damaged and becomes "leaky" (e.g., the diode formed by the drain/channel p-n junction), then the nFET exhibits abnormal source/drain leakage current only when the undamaged diode is forward biased.

Figure 4A:
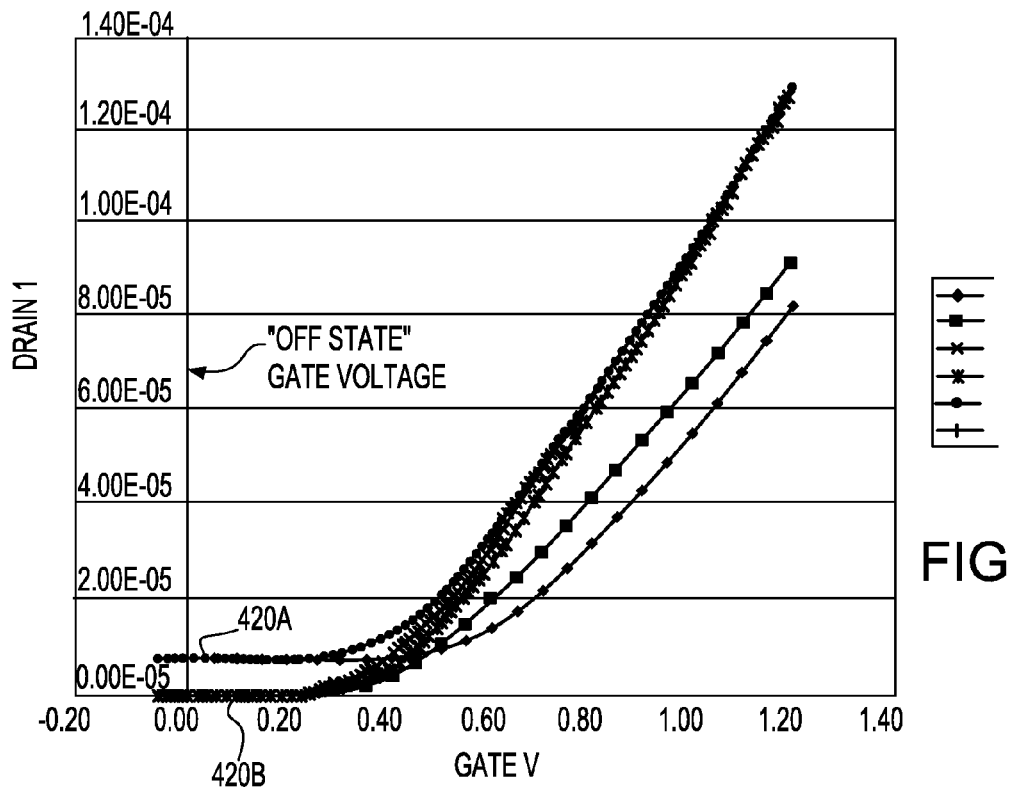
FIG. 4A is a graph showing drain current (leakage current) (I) versus gate voltage (V).
Figure 4B:
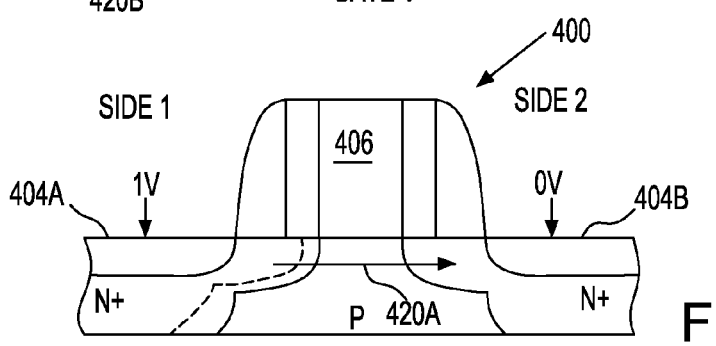
FIG. 4B is a diagram illustrating the asymmetric leakage current in an nFET caused by damage to one of its extensions (source or drain).
Figure 4C:
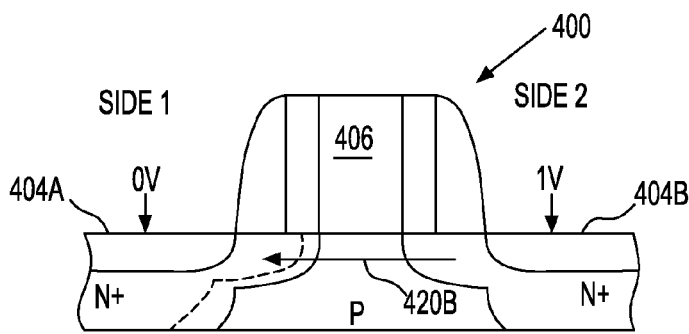
FIG. 4C is a diagram illustrating the asymmetric leakage current in an nFET caused by damage to one of its extensions (source or drain).

Referring to FIGS. 4A, 4B and 4C, electrical measurements made on failed nFETs as shown and described above with respect to FIG. 3B shows asymmetrical leakage current when the NFET is in off state (gate voltage=0V). FIG. 4A is a graph showing off-state current flow for the transistor 400 shown in FIGS. 4B and 4C. FIGS. 4B and 4C depict the same transistor 400 under different bias conditions. The transistor 400 has a damaged drain extension (see FIG. 3B). In both FIGS. 4B and 4C, the gate 406 of the transistor 400 is swept from −0.2V to about 1.2V to produce the gate voltage vs. leakage current plot shown in FIG. 4A. The "off-state" leakage current is measured at the point where the gate voltage is equal to 0.0V. In FIG. 4B, the source 404B is biased at 0.0V while the drain 404A is biased at 1.0V. This produces a first drain current 420A as a function of the gate voltage, shown on the graph of FIG. 4A. In FIG. 4C, the source 404B is biased at 1.0V while the drain 404A is biased at 0.0V. This produces a second drain current 420B as a function of the gate voltage, also shown on the graph of FIG. 4A. Note that in FIG. 4A, the off-state leakage current 420A (where the gate voltage=0.0V) produced by the bias conditions shown in FIG. 4B is considerably higher than the off-state leakage current 420B produced by the bias conditions of FIG. 4C. The off-state leakage current 420B is approximately 1e-5 amps (about 0.01 milliamps), while the off-state leakage current 420C is extremely low, effectively undetectable at the scale of the graph as shown.

A significant problem being addressed by the present invention is that one (a single) transistor failing can render inoperable the whole chip containing millions of transistors. (Assuming that there is no redundancy mechanism built into the chip to "deactivate" defector transistors and/or sectors.)

Generally, it can be seen from the above, that defect, such as the Boron diffusion defect described above, may be asymmetrical and affect one junction and not the other. Thus, the defect can be detected by measuring current flowing in a forward-biased direction between the source and drain (with a given gate voltage), then swapping the voltage to be reverse-biased, the defect can be detected. As described below, test structures and methods are disclosed to detect such failures, at M1.

When Side 1 of the NFET was positively biased relative to Side 2 (for example, Side 1 was biased at 1V while Side 2 was biased at 0V), a large leakage current as large as 1e-5A (0.01 milliamps) was detected. However, when Side 1 was negatively biased relative to Side 2 (for example, Side 1 was biased at 0V while Side 2 was biased at 1V), no leakage current (except for regular off state transistor current) could be detected.

One of the hypotheses is that Boron in the P+ implant region diffuses into Side 1 of the NFET (dashed line extending through the N+ diffusion) and damages the junction, therefore making the NFET behave like a PN diode. Regardless of the hypotheses, this is a layout-dependent failure that exhibits itself as unsymmetrical (or asymmetrical) transistor leakage and could cause significant yield loss in semiconductor manufacturing if not detected early.

Other than the mechanism described above, there are many other mechanisms that could cause similar asymmetric transistor leakage. For example, a silicide defect that is layout sensitive can damage one side of the source/drain junction and cause asymmetric transistor leakage as well. Currently, these types of defects are typically defected during product testing, and by the time the defects are detected, there may have already been many lots manufactured with similar defects already processed passed the step where it can be fixed and as a result, many chips may need to be discarded due to the late detection. Therefore, it is very important to have test structures and methods to detect these types of defects early in the process flow.

The present inventive technique provides a test structure and associated testing method to detect this type of asymmetric leakage failure early in the fabrication process flow.

To detect asymmetric MOSFET leakage in a transistor, preferably one would "ground" the gate and body of the transistor to be tested, then apply a biasing voltage source across the transistor's drain and source (e.g., grounded source with +1.0 volt applied to drain) while monitoring source to drain current. The polarity of the biasing voltage would then be reversed (e.g., grounded drain with +1.0 volt applied to source) and the source to drain current would again be monitored. Any significant difference in the magnitude of current flow in the two current measurements would be an indication of asymmetric leakage.

Those of ordinary skill in the art will immediately appreciate and understand that the problems associated with applying such a direct leakage test to each and every NFET on even a small portion of a typical modern semiconductor device are daunting in the extreme, and completely impractical. Any scheme capable of such testing would require radical changes to the SRAM cell architecture and layout to incorporate circuitry and wiring to isolate the individual NFETs for testing and to provide test access points. Such modifications would greatly increase the overall size of the SRAM array and would incur such a heavy cost on SRAM array size and performance that they would likely compromise the commercial and/or functional viability of the device in which the SRAM array resides.

Some prior art exists that measures transistor current in an SRAM cell, where the transistors in a single SRAM cell are wired out at metal 1 and metal 2 levels from a small representative SRAM array. However, due to the relatively low defect probability associated with the asymmetric leakage described hereinabove realistically estimated at about one transistor in 50 million (about 1 in $5 \times 10^7$, or a defect density of about 20 parts per billion—about $2 \times 10^{-8}$) such a testing strategy is unlikely to detect the failures. To raise the probability of a defective cell occurring within a test array to "detectable" levels (assuming one chip failure per wafer of 70 chips), it would be necessary to provide a test structure containing at least 400000 SRAM cells. However, as the number of cells simultaneously tested grows, the aggregate off-state current (normal leakage) of all of the "normal" SRAM cells becomes far greater than the asymmetric leakage associated with a single defective cell, making it impossible to reliably detect a defective cell in the test array by this method.

Test Structures For Detecting Unsymmetrical Transistor Leakage Defect

Figure 5A:
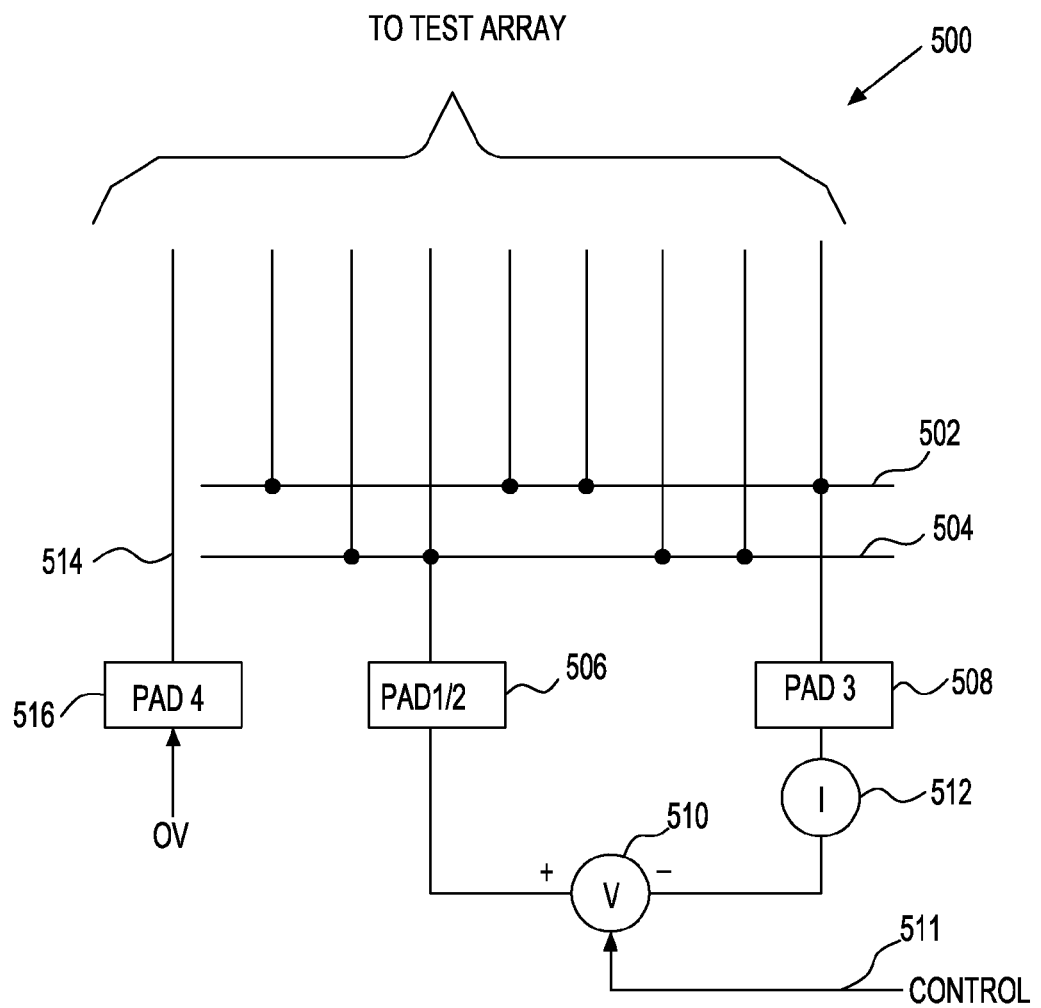
FIG. 5A is a diagram of a test structure and method, according to the invention.
Figure 5B:
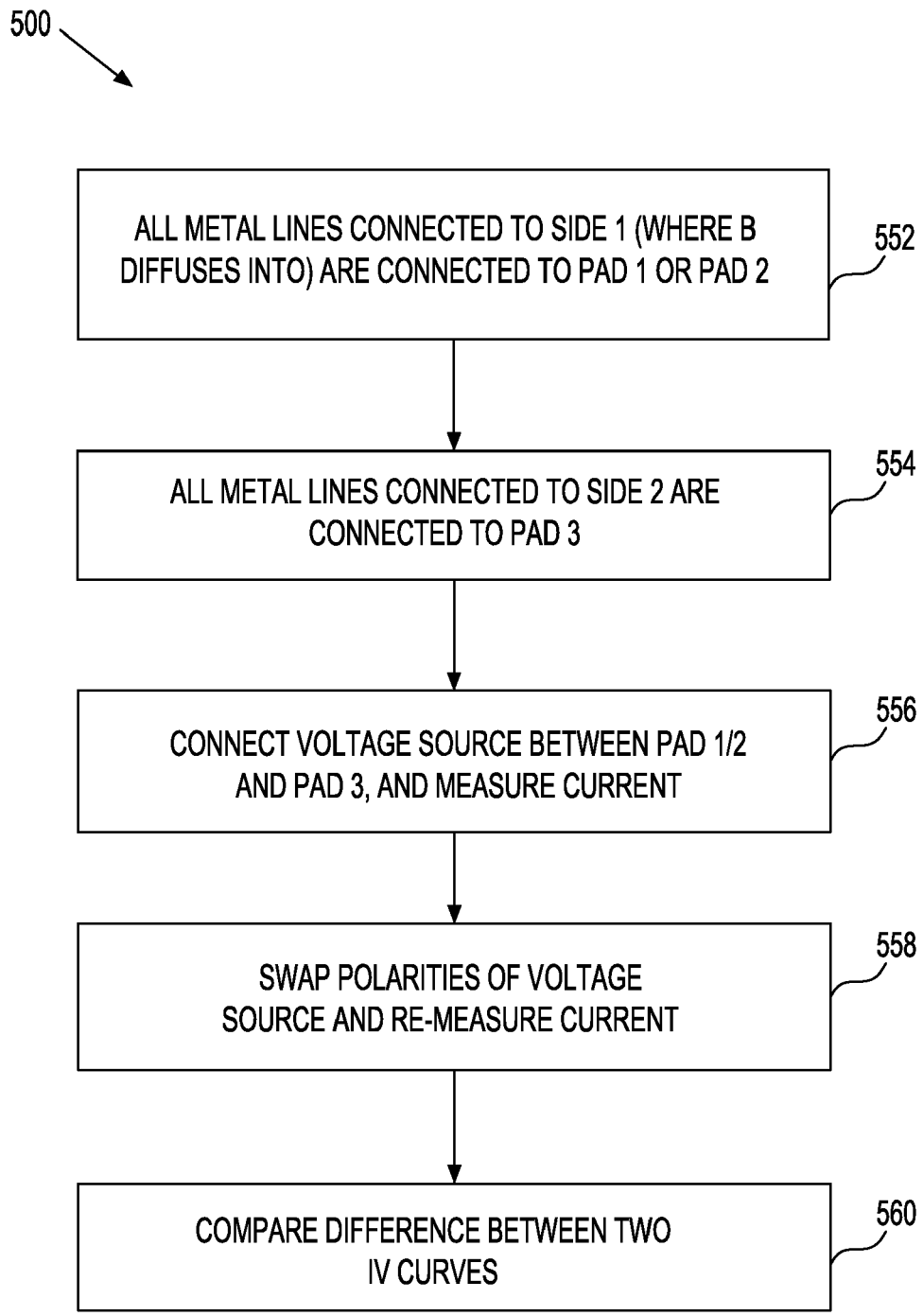
FIG. 5B is a flowchart of a test method, according to the invention.

FIG. 5A is a diagram of a test structure, according to the invention. FIG. 5B is a flowchart of a test method for applying the test structure of FIG. 5A to a large array of transistors (e.g., nFETs in a large SRAM array), such as that shown and described below with respect to FIGS. 6A, 6B and 6C, in accordance with the invention.

According to the present inventive technique, a test array substantially identical to one or more large "real" arrays (e.g., one or more large SRAM arrays) is laid out on the same reticle side-by-side with a "real" array and fabricated such that the geometries, alignments and chemistries of the implantation regions, diffusions, oxides, poly, etc. of the test array are identical to those of the "real" array until just prior to first metallization (M1). In this way, any variation in process parameters and/or mask alignment that affect the "real" array will also affect the test array in substantially identical fashion. At first (and subsequent) metallization, conductors within the test array are disposed such that large groups of transistor sources are tied together electrically and brought out to one or more test pads. For the same transistors, drains are tied together electrically and brought out to one or more additional test pads. Finally, the gates of the same transistors are tied together and brought out to one or more additional test pads. Preferably, the large array is broken into subgroups with independent source and drain conductors associated with each subgroup. "Normal", functional metallization (i.e., according to the intended purpose of the "real" array) can be provided within the "real" array.

In FIG. 5A, the test structure 500 comprises a voltage source 510 and current monitor 512 applied to pads 506 and 508 associated with a test array. Pad 506 ("Pad 1/2") connects in common via conductors 504 in the metallization layer(s) of the test array to a first side (e.g., source or drain) of all of the transistors in a set of transistors in the test array to be tested for asymmetric leakage. Pad 508 ("Pad 3") connects in common via other conductors 502 in the test array metallization layer to a second, opposite side (drain or source) of the same set of transistors. Another pad 516 ("Pad 4") connects to all of the gates of the same set of transistors via conductors 514. An appropriate "off-state" gate voltage (e.g., 0.0V) is applied to the gates via the pad 516 ("Pad 4") while a first bias voltage is applied to the first sides of the transistors via the pad 506 ("Pad 1/2") and a second bias voltage is applied to the second sides of the transistors via the pad 508 ("Pad 3"). With the biasing voltages applied, a first leakage current in the transistors is measured via the current monitor 512. The biasing voltages are then switched in response to an external control signal 511 such that the bias voltage originally applied to "Pad 1/2" (506) is applied to "Pad 3" (508) and vice versa. A second leakage current is then measured via current monitor 512 and compared to the first leakage current. If either leakage current is above a predetermined threshold current and is significantly greater than the other leakage current, then this is an indication of asymmetric leakage within the tested transistors in the test array.

The test structure is readily adapted to the specific needs of a design. For example, in the aforementioned SRAM asymmetric leakage example, failures in certain transistors are generally indicative of mask misalignment in a particular direction, while failures in other transistors are generally indicative of mask misalignment in a different direction. By organizing the connections to these groups transistors in the test array so that they can be tested independently, the direction of mask misalignment can be determined by examining the test results and the amount of investigation and analysis required to take appropriate corrective action can be greatly reduced. In the case shown in FIG. 5A, the designation "PAD 1/2" indicates that there are two sets of connections to transistors via the pad 506. If, instead pad 506 is split into two separate pads "PAD 1" and "PAD 2", then separate leakage measurements can be made for each of the two groups of transistors.

Those of ordinary skill in the art will immediately understand and appreciate that in the context of the present inventive technique, a "pad" is any means by which a test connection can be made to the test array. Typically, such pads are large conductive "landing areas" where a test probe can make contact.

Figure 6A:
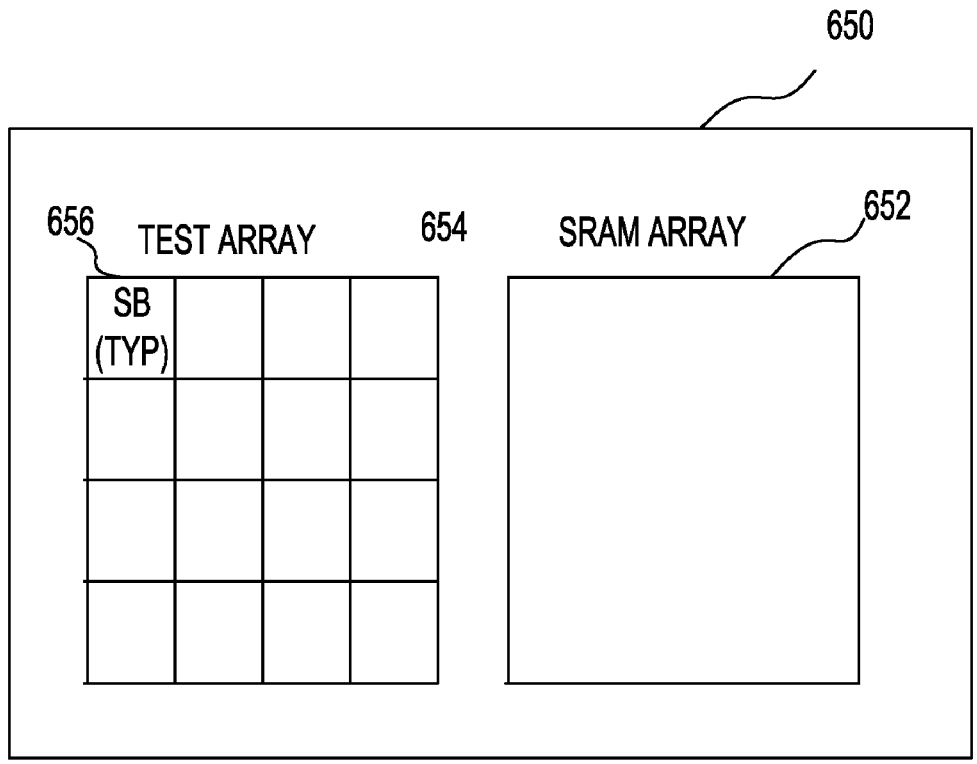
FIGS. 6A, 6B and 6C are block diagrams illustrating the sub-block architecture of the test structure of this invention.

FIG. 6A shows a generalized block diagram representative of the present inventive technique. In the Figure, an SRAM array 652 is implemented side-by-side with a test array 654, on the same reticle 650 so that process variations that affect the SRAM array 652 will affect the test array 654 in similar fashion. Accordingly, the probability of asymmetric leakage due to global process variations (like subtle mask alignment variations) can be expected to be approximately equal for both the SRAM array 652 and the Test array 654. The two arrays 652 and 654 are substantially identical to one another up until metallization, at which point they differ. The test array 654 is connected to facilitate asymmetric leakage testing, while the SRAM array 652 is connected for normal circuit function.

As described hereinabove, the aggregate "normal" transistor leakage current from all of the transistors in a large array would be large enough that when looking for asymmetric leakage by parallel testing (see FIG. 5A), the baseline "normal" leakage would be far greater than the expected abnormal asymmetric leakage. In order to address this, the present inventive technique breaks up the test array into a logical set of sub-blocks (SB) 656 (without actually changing anything in the front-end (FEOL) layout of the array). Each sub-block (SB) 656 is provided with an independent set of source/drain connections that can be independently accessed by means of a test multiplexer to isolate leakage current measurements to a single sub-block 656. The sub-block size is determined by selecting a number of transistors such that the "normal" aggregate leakage current for those transistors is significantly lower (e.g., by an order of magnitude) than the leakage current associated with a single damaged transistor.

Figure 6B:
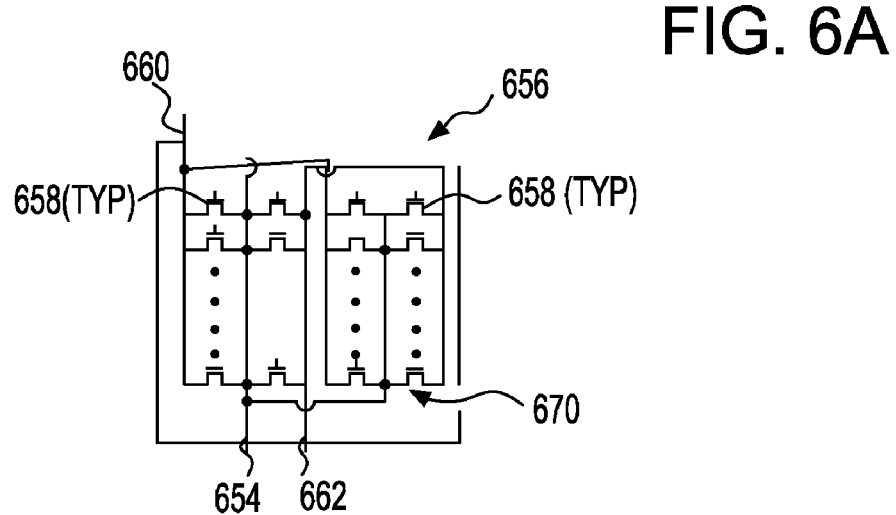

FIG. 6B is a diagram of a representative sub-block 656. The sub-block 656 includes a plurality of transistors 658 to be tested for asymmetric leakage. Conductors (660, 663, 664, 670) are provided in the metallization layers for the sub-block 656 to connect in common to various parts of the transistors 658. A first conductor 660 ("P1") connects in common to all of the drains of a first group of the transistors 658. A second conductor 662 ("P2") connects in common to all of the drains of a second group of the transistors 658. A third conductor 664 ("P3") connects to all of the sources of all of the transistors 658 (both groups) in common. A fourth conductor ("P4") connects to all of the gates of all of the transistors 658 (both groups) in common.

Preferably, all of the conductors (660, 663, 664, and 670) are implemented in the first metallization layer (M1), to permit testing as early as possible.

Figure 6C:
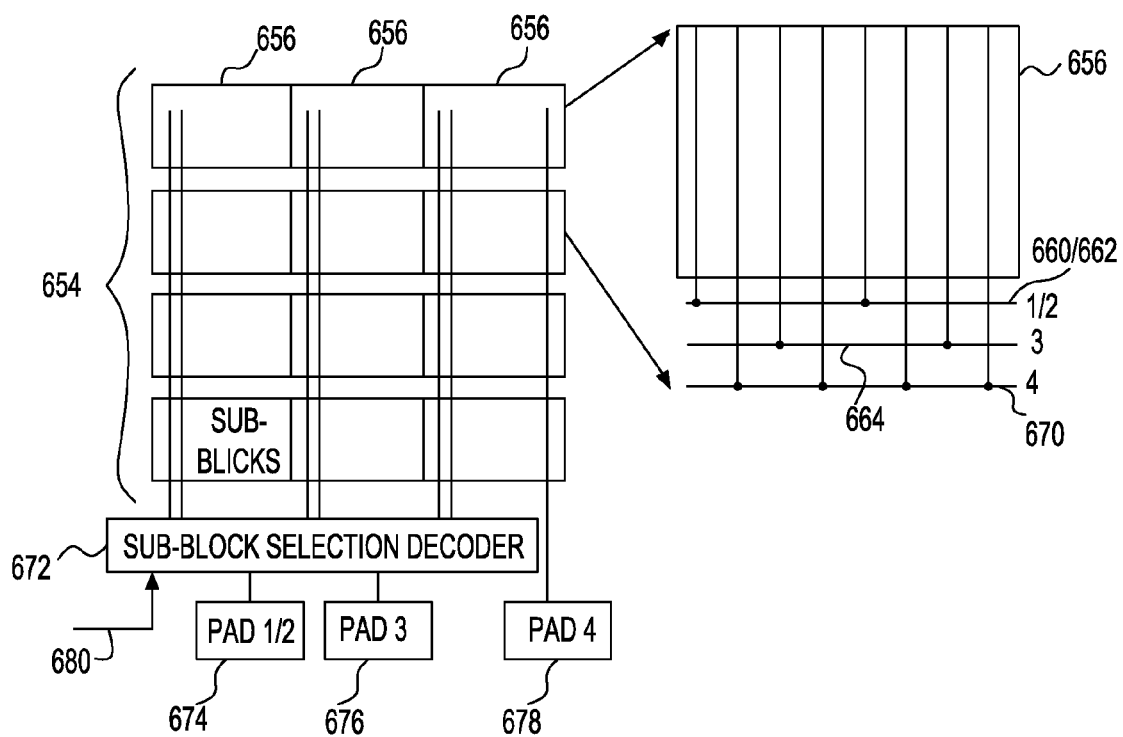

FIG. 6C is a block diagram showing test connections for the whole test array 654. A sub-block selection decoder 680 (essentially an analog multiplexer) allows conductors for specific sub-blocks 656 to be connected individually to test pads "PAD 1/2" 674 and "PAD 3" 676. "PAD 4" 678 connects in common to all of the "P4" connections 670 in all of the sub-blocks 656. Under control of a selection signal 680 (provided via either on-wafer circuitry or directly via test pads) the Sub-block selection decoder 680 is commanded to connect a specific "P1" 660 or "P2" 662 connection from a specific sub-block 656 to "PAD 1/2" and to simultaneously connect the "P3" connection 664 from the same sub-block 656 to "PAD 3" 676. The sub-block is then tested for asymmetric leakage via the test pads (674, 676, 678) as described above, and the sub-block selection decoder 680 is commanded to connect the test pads to the next sub-block. This process is repeated for each sub-block (and each transistor grouping in each sub-block) until all sub-blocks have been tested.

The test procedure 550 of FIG. 5B is now described. During the entire test procedure 550, leakage current measurements are taken with the gate voltages of the transistors in the test array set to an appropriate "off-state" voltage (e.g., 0.0V) via PAD4 (678). In a first step 552 all conductive lines connected to a first side (side 1) of a group of transistors in a sub-block to be tested are connected to PAD1/2 (674), using the sub-block selection decoder (680) of FIG. 6C.

In a next step 554 all conductive lines connected to a second side (side 2) of the transistors in the sub-block are connected to PAD3 (678), again using the sub-block selection decoder (680) of FIG. 6.

In a next step 556, a voltage source (510) is connected to PAD1/2 (674) and PAD3 (676) such that a first voltage (e.g., 0V) is applied to PAD1/2 (674) and a second voltage (e.g., 1.0V) is applied to PAD3 (676), the current between the pads is measured (512) and the result is stored.

In a next step 558, the polarities applied to PAD1/2 674 and PAD3 676 are swapped (reversed) and the current is measured again. Another measurement is taken, and the result is stored.

In a next step 560, the off-state leakage current measurements which were obtained in the previous steps 656 and 658 is calculated, and if there is (i) a significant leakage current in at least one direction and (ii) a significant difference between the two leakage currents, this is indicative of the asymmetric failure discussed above. (A failure is declared.)

Returning to FIG. 6C, the test structure is divided into a plurality of sub-blocks. The size of each sub-block is determined by $I_{leakage}/I_{off}$ ratio. For example, a realistic ratio would be 1e-5/1e-9=10000. The design guideline for sub-block size is that the leakage of one defective transistor in the sub-block should be at least 2 times larger than sum of $I_{off}$ of all non-defective transistors in the sub-block so that the leakage current cause by a single defect in the whole sub-block can be easily identified. Therefore, in this exemplary case a realistic size of a sub-block is 1666, which is 10000/3*2 (considering even and odd columns separately).

To implement the test methodology, an array of memory cells may be divided into a number of sub-blocks (or blocks). For example, a whole array may be divided into sub-blocks of about 1000 cells each (each cell comprises a 6T-SRAM). A sub-block selection decoder connects sub-blocks selectively to PADs1/2, and PAD3.

The size of each sub-block may be determined as follows. The leakage current (I_leakage) of one defective transistor in a sub-block should be significantly greater (e.g., ten times greater) than the sum of the leakage (or "off") currents (I_off) of all the non-defective transistors in the sub-block.

For example, the leakage current (I_leakage) of one defective transistor may be on the order of 1e-5A (one hundredth of a milliamp, or 10 microamps). The off current (I_off) for all of the transistors in the sub-block may be 1e-9, which is ten thousand times less than I_leakage for a single defective transistor. In other words, the leakage current from one defective cell is approximately equivalent to the total aggregate off-state leakage current for ten thousand non-defective cells. Using a "safety" factor of 10, to ensure defect detectability, this means that each sub-block should contain only approximately 1000 cells (such as 1024, or $2^{10}$ cells), which is ten thousand divided by ten.

If the sub-block were too big (too many cells), the aggregate total of off-state currents (total I_off) for the non-defective cells would be large enough that the additional leakage current (I_leakage) from a single defective cell would be difficult or impossible to detect. Accordingly, the sub-block size (in cells) is chosen so that the aggregate total off-state leakage current from non-defective transistors (cells) will be relatively small compared to the leakage current (I_leakage) from a single defective transistor by a "safety factor" of 10:1, for example. Of course, smaller safety factors (e.g., 2:1, 3:1 or 5:1) could be used, as well, depending upon the specific characteristics of the equipment used in testing. For example, with a 10000:1 ratio of defective leakage current to non-defective leakage current, a sub-block could contain approximately 2000 (10,000/5) based on a 5:1 safety margin, or 5000 (10,000/2) cells based on a 2:1 safety margin. Preferably, the nearest binary multiple (e.g., 4096 or 2048) would be chosen, since groupings according to integer powers of two may be advantageous in array architectures, since they may be more "natural" to address.)

On the other hand, if the sub-block were too small (fewer cells), this would lessen the efficiency of the test methodology. For the exemplary cases shown and described hereinabove, establishing sub-blocks with 1000 (1024, $2^{10}$) cells each provides an efficient test methodology.

The sub-blocks may be tested one at a time, and a sub-block selection decoder may be used to select the sub-block being tested. Furthering the example, when using a 5-bit ($2^5$=32) decoder, each array can have 32 sub-blocks, or 32*1024 cells. Each array can be replicated multiple times, or a bigger decoder can be used, to satisfy the total number of cells requirement.

It should be understood that the "sub-blocks" referred to herein may also simply be referred to as "blocks". The important thing is that there are several of them in a group of cub-blocks (or blocks) being tested, and that group may be referred to as the "array" or may also be referred to as a "sub-array" wherein several sub-arrays constitute an overall array.

As illustrated in the figure, a sub-block selection decoder takes the sub-block address, output to turn on and off each transmission gate (in the sub-block decoder). 5-bit, 5 input address pins, 32 output lines for 32 sub-blocks (only 6 shown). The transmission gate is used to control the current to the sub-block.

Leakage Current Estimation: 5-Bit Decoder Example

Using equivalent resistances, leakage current may be estimated. Take, for example, a plurality (n, such as n=32) of sub-blocks (SB), each having a transmission gate (TG) connected in series therewith.

For a typical SRAM FET in 45 nm technology, the "on" current (Ion) is approximately a tenth of a milliamp (~1e-4A), and the "off" current (Ioff) is approximately one thousandth of a microamp (~1e-9A)

When a sub-block is off, the sum of off current at 1V is 1e-6A, equivalent R=1e6 ohm Assume TG is a NFET 10 times wider than the SRAM PD NFET, the TG "off" current is 1e-8A, and at 1V, RTGoff=1e8 ohm. The TG "on" current is 1e-3A, RTGon=1e3 ohm.

In order to reduce the chance of defective a TG, it may be advantageous to use longer Lpoly for the TG's nFET, and to scale up width accordingly to keep W/L (transistor width/length ratio) 10 times the W/L of pulldown (PD) nFETs in the SRAM cells.

When there is a defect in sub-block, the total current can be expected to be about 1e-5+1e-6A~1e-5A, R=1e5 ohm Under normal operating circumstances each sub-block (SB) and associated (TG) may exhibit a resistance, R=1e6 ohm+1e8 ohm, resulting (at 1V) in a current of I-1e-8A Assume that there are 32 sub-blocks, each having a TG associated therewith (and equivalent resistances calculated at 1V), if there is a defect in one of the sub-blocks (and the other 31 do not have defects), with the TG on (i.e., in a conducting state):
R=1e5 ohm+1e3 ohm, resulting (at 1V) in a current of I~1e-5A Therefore, signal 1e-5A>>noise 31*1e-8 (where "signal" refers to the leakage current from a defective transistor and "noise" refers to the aggregate total of normal off-state leakage current for all of the non-defective transistors in the sub-block). In other words, the signal indicative of a defect in a selected one of the 32 (e.g.) sub-blocks is much larger than the sum of the off currents in the remaining 31 (e.g.) sub-blocks.

The term "substrate", as used hereinabove, is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of detecting asymmetric leakage in an array of field-effect transistors, each having a channel, a source diffusion on one side of the channel, and a drain diffusion on another side of the channel, the method comprising:
   connecting together a first side of all of the transistors in common with first side connections;
   connecting together a second side of all of the transistors in common with second side connections;
   applying a biasing voltage across the first and second side connections;
   measuring a first leakage current between the commonly connected first and second side connections;
   reversing the biasing voltage across the first and second side connections;
   measuring a second leakage current between the commonly connected first and second side connections; and
   comparing the first and second leakage current measurements.

2. The method of claim 1, including:
   connecting gate terminals of all of the transistors in common and applying an off-state voltage to the common gate connection.

3. The method of claim 1, including:
   forming a junction at each diffusion with the channel; and
   causing asymmetrical leakage resulting from a diffusion defect, a silicide defect, or a substrate defect affecting one junction and not the other.

4. The method of claim 1, including:
   causing the asymmetrical leakage by layout-sensitive defects.

5. The method of claim 1, wherein:
   the method of detecting leakage comprises swapping the biasing voltage polarity while measuring leakage current in one direction and the opposite direction and comparing the difference of current-voltage curves measured in order to detect the leakage current.

* * * * *